(12) United States Patent
Nagasaki et al.

(10) Patent No.: US 8,636,523 B2
(45) Date of Patent: Jan. 28, 2014

(54) SURFACE MOUNT CONTACT AND CONNECTOR USING SAME

(75) Inventors: Taisuke Nagasaki, Kanagawa (JP); Hirokazu Kato, Kanagawa (JP)

(73) Assignee: Tyco Electronics Japan G.K., Kanagawa-ken (JP)

( * ) Notice: Subject to any disclaimer, the term of this patent is extended or adjusted under 35 U.S.C. 154(b) by 63 days.

(21) Appl. No.: 13/186,864

(22) Filed: Jul. 20, 2011

(65) Prior Publication Data

US 2012/0021657 A1    Jan. 26, 2012

(30) Foreign Application Priority Data

Jul. 20, 2010 (JP) ................................ 2010-163287

(51) Int. Cl.
*H01R 12/00* (2006.01)

(52) U.S. Cl.
USPC ........................................... 439/83; 439/439

(58) Field of Classification Search
USPC .................. 439/83, 413, 427, 439–441, 876
See application file for complete search history.

(56) References Cited

U.S. PATENT DOCUMENTS

| | | | |
|---|---|---|---|
| 5,653,601 A * | 8/1997 | Martucci et al. | 439/82 |
| 5,713,767 A * | 2/1998 | Hanson et al. | 439/853 |
| 7,357,651 B2 * | 4/2008 | Minoura et al. | 439/82 |
| 7,361,062 B2 * | 4/2008 | Long et al. | 439/668 |
| 7,448,901 B2 * | 11/2008 | Weber et al. | 439/427 |
| 7,513,793 B2 * | 4/2009 | Horst et al. | 439/427 |
| 7,780,467 B2 * | 8/2010 | Daily | 439/440 |
| 2006/0189174 A1 | 8/2006 | Fabian et al. | |
| 2008/0153344 A1 | 6/2008 | Horst et al. | |

FOREIGN PATENT DOCUMENTS

| | | |
|---|---|---|
| DE | 102004049575 A1 | 4/2006 |
| DE | 102005050796 A1 | 4/2007 |
| JP | 2006-114791 | 4/2006 |
| JP | 2009-099627 | 5/2009 |
| JP | 2010514138 A | 4/2010 |

OTHER PUBLICATIONS

European Search Report, Application No. 11174763.0, dated Oct. 27, 2011, 8 pages.

* cited by examiner

*Primary Examiner* — Thanh Tam Le
(74) *Attorney, Agent, or Firm* — Barley Snyder

(57) ABSTRACT

A connector includes a surface mount contact and housing. The surface mount contact has a cylindrical portion, a lance, and a pair of surface mount soldering portions. The cylindrical portion has a cylindrical shape into which a wire core of an electrical wire is inserted. The lance is positioned in an intermediate portion of the cylindrical portion along an axial direction thereof and secures the wire core when the electrical wire is inserted. The pair of surface mount soldering portions project from the cylindrical portion. Each of the pair of surface mount soldering portions extend from an end of the cylindrical portion in a direction orthogonal to the axial direction.

9 Claims, 7 Drawing Sheets

SURFACE MOUNT CONTACT AND CONNECTOR USING SAME

CROSS-REFERENCE TO RELATED APPLICATIONS

This application claims the benefit of the filing date under 35 U.S.C. §119(a)-(d) of Japanese Patent Application No. JP 2010-163287, filed Jul. 20, 2010.

FIELD OF THE INVENTION

The invention relates to a surface mount contact and in particular to a surface mount contact positioned on a substrate on which an LED module is mounted.

BACKGROUND

LED lighting equipment is well known to the public. In LED lighting equipment, for example, an LED module is mounted on a substrate and an LED package constituting a substrate in which an LED chip is enclosed is used. In the LED module and in the LED package, power to the LED chip is compulsory.

Conventionally, a known technology is disclosed in JP 2009-99627 A, wherein an input terminal of an LED mounted substrate connects to an output terminal of an AC-DC converter connected to a commercial power supply using a lead wire, to power the LED chip. In the technology disclosed in JP 2009-99627 A, the lead wire is directly soldered to the input terminal of the LED mounted substrate.

It is disclosed in JP 2006-114791 A an LED connector having a socket contact to elastically contact a terminal of an LED chip, the socket contact having a wire connecting section where the socket contact connects an electric wire connected to a power supply, for energizing the LED chip. In the socket contact, the electrical wire is connected to the wire connecting section by crimping.

Furthermore, it is shown in FIG. 8 (see JP 2010-514138 A) a known low-profile surface mount push-in connector to power the LED chip.

The known push-in connector shown in FIG. 8 is composed of an insulating housing 110 shown in FIG. 8A and two contacts 120 shown in FIG. 8B, which are received in the housing 110. The push-in connector is mounted, for example, on a substrate 40 on which an LED module is mounted (see FIG. 4), or on a substrate 62 made up of an LED package (see FIG. 6).

Herein, the housing 110 is made by molding insulating resin, on the front (the left side in FIG. 8A) of which two openings 111 for inserting an electrical wire are formed. The electrical wire (not shown) is connected to a power supply.

Further, each contact 120 has a cylindrical small-diameter portion 121 and a cylindrical large-diameter portion 122 connected to the front end of the small-diameter portion 121 as shown in FIG. 8B. The each contact 120 is made by stamping and forming a metal plate. On a bottom wall of the large-diameter portion 122, a lance 123 is provided, which is cut from, bent, and extends diagonally from the bottom wall toward the inside of the small-diameter portion 121. At the tip of the lance 123, a sharp edge 124 is formed. The electrical wire is inserted into the large-diameter portion 122 through the opening 111 of the housing 110 while being guided thereto, but the tip of a covering portion of the electrical wire abuts against a shoulder 122a formed in the large-diameter portion 122 to prevent further insertion of the electrical wire. Upon slightly pulling out the electrical wire, the sharp edge 124 formed on the tip of the lance 123 bites into a wire core projected from the front end of the covering portion of the electrical wire for connecting the electrical wire to the contact 120, and stopping the electrical wire from removal. Thus, a contact which can be connected to the electrical wire by merely inserting the electrical wire into the contact is generally called as a push-in contact.

Moreover, at the front end (the left side shown in FIG. 8B) of the large-diameter portion 122, a surface mount soldering portion 125 is provided. The surface mount soldering portion 125 extends forward along an axial direction of the contact 120 from the bottom of the front end of the large-diameter portion 122. On the other hand, a surface mount soldering portion 126 is positioned at the rear end of the small-diameter portion 122. The surface mount soldering portion 126 extends backward along an axial direction of the contact 120 from the bottom of the rear end of the small-diameter portion 121. These surface mount soldering portions 125,126 are solder connected, for example, to the substrate 40 on which the LED module is mounted, or to a conductive pad formed on the substrate 62 made up of the LED package. The conductive pad is electrically connected to an electrode of the LED chip, which electrically connects the electrical wire with the electrode of the LED chip, enabling power to an LED.

These conventional prior art teachings, however, have problems as will be shown below.

Namely, in case of the technology disclosed in JP 2009-99627 A, the lead wire is directly solder connected to the input terminal of the LED mounted substrate. Therefore, the technology requires additional labor to wire the electrical wire to the input terminal and to solder the wire core of the electrical wire carried on to the input terminal. As a result, the process provides poor assembly and inefficiency.

Furthermore, in the technology disclosed in JP 2006-114791 A, the electrical wire is connected to the electrical wire connecting section of the socket contact by crimping. Therefore, additional work is required in wiring the electrical wire to the electrical wire connecting section of the socket contact and crimping the end of the electrical wire carried on to the electrical wire connecting section using a crimping tool, which leads to inefficiency.

Meanwhile, in case of the low-profile surface mount push-in connector disclosed in JP 2010-514138 A shown in FIG. 8, amelioration of workability of connection of the electrical wire, and assembly working efficiency may be achieved as well, due to the adoption of the push-in contact.

Nevertheless, in the low-profile surface mount push-in connector disclosed in JP 2010-514138 A, the large-diameter portion 122 to guide the tip of the covering portion of the electrical wire to the contact 120 is provided, and the large-diameter portion 122 is positioned with the shoulder 122a to stop insertion of the tip of the covering portion of the electrical wire. Accordingly, enlargement of the contact 120 occurs by the presence of the large-diameter portion 122. It follows, in addition thereto, that enlargement of the push-in connector in which the contact 120 is received occurs. Thus, the enlarged contact 120 and the push-in connector create a situation where light emitted from the LED is blocked by the connector, providing degradation of, so-called, light distribution characteristics.

Moreover, in case of the low-profile surface mount push-in connector disclosed in JP 2010-514138 A, the surface mount soldering portion 125 of the contact 120 extends forward along an axial direction of the contact 120 from the front end of the large-diameter portion 122. Further, the surface mount soldering portion 126 extends backward along an axial direction of the contact 120 from the rear end of the small-diameter portion 121. Therefore, the dimensions of the contact 120 are long in the axial direction, which induces enlargement of the contact 120. This also gives rise to enlargement of the connector, and consequently creates degradation of, so-called, light distribution characteristics.

Occasionally, a situation arises where the axial length of contact 120 is too long, which precludes mounting of the contact 120 on a small-sized substrate. In addition, a large surface mounting area of the contact 120 requires the distance (creepage distance) from a heat radiation plate (heat sink) disposed on the back side of the substrate to the substrate to be lengthened, where the LED module is mounted and to which the surface mount soldering portions 125,126 are soldered, or to the conductive pad formed on the substrate as the LED package. Thus, there has been a need to make the size of the substrate itself larger. Nonetheless, it would not be appropriate since making the size of the substrate larger runs counter to a customer's demand for downsizing of the substrate. Further, in cases where the contact 120 and the heat radiation plate are positioned on the back side of the substrate, the large mounting area of the contact 120 introduces a problem that a region of the heat radiation plate is smaller, causing degradation of heat radiation characteristics.

SUMMARY

Accordingly, the invention is made in view of the aforementioned problems and its objective is to provide a surface mount contact which is excellent in assembly working efficiency, in the light distribution characteristics and heat radiation characteristics, and is capable of lengthening the creepage distance from the heat radiation plate and a connector using the contact.

The surface mount contact includes a cylindrical portion, a lance, and a pair of surface mount soldering portions. The cylindrical portion has a cylindrical shape into which a wire core of an electrical wire is inserted. The lance is positioned in an intermediate portion of the cylindrical portion along an axial direction thereof and bites into the wire core when the electrical wire is inserted. The pair of surface mount soldering portions project from the cylindrical portion. Each of the pair of surface mount soldering portions extend from an end of the cylindrical portion in a direction orthogonal to the axial direction.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 8 shows the conventional low-profile surface mount push-in connector, in which

DETAILED DESCRIPTION OF THE EMBODIMENT(S)

Hereinafter, a description will be made to an embodiment of the present invention with reference to the accompanying drawings.

Figure 1:
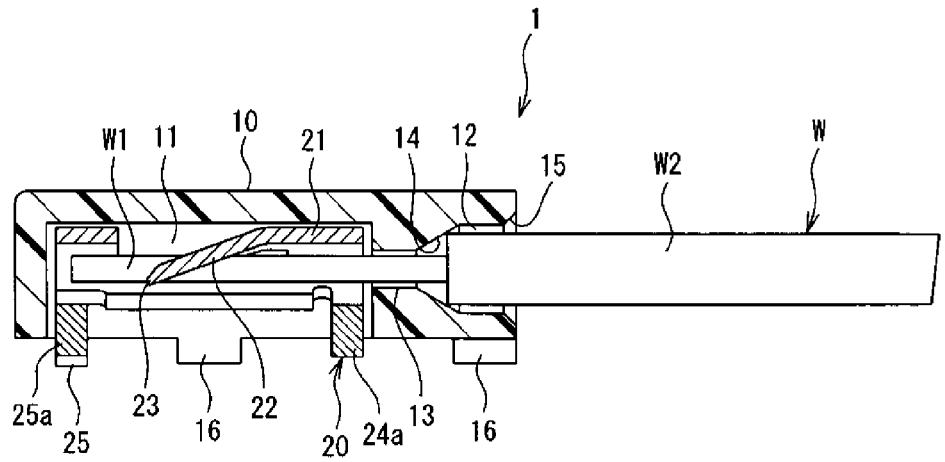
FIG. 1 is a sectional a connector according to the invention, in which an electrical wire is also shown.

Herein, the connector 1 includes a housing 10, and a surface mount contact (hereafter simply referred to as a contact) 20 received in the housing 10. In FIG. 1, a lance 22 is depicted where the lance 22 is not in a bending state by an electrical wire W, but in an initial state.

Figure 2A:
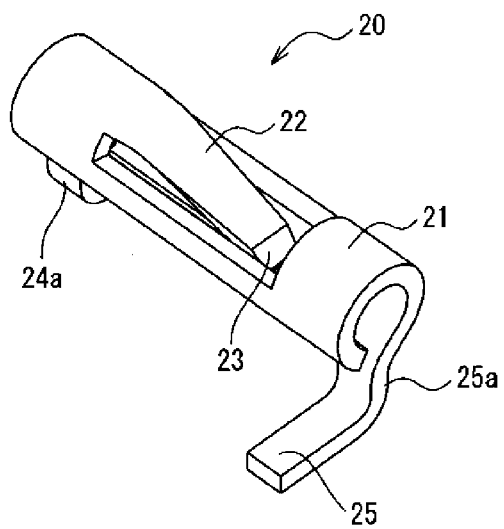
FIG. 2A is a perspective view of a surface mount contact according to the invention used in the connector shown in FIG. 1, shown from obliquely upward toward a rear side.
Figure 2B:
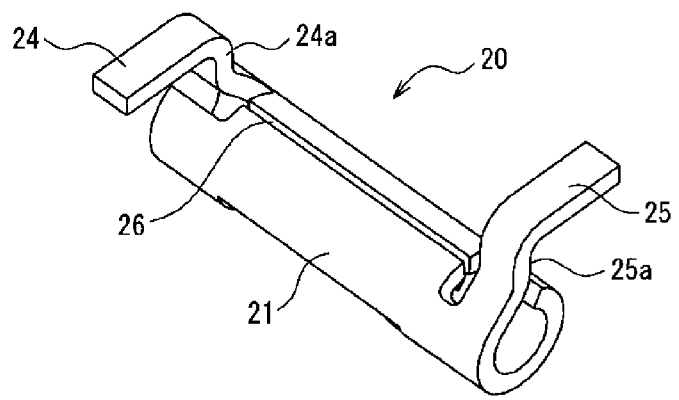
FIG. 2B is a perspective view of the surface mount contact according to the invention used in the connector shown in FIG. 1 shown from obliquely downward toward the rear side.

In the embodiment shown, the contact 20 is a so-called push-in contact and has a cylindrical portion 21 formed in a cylindrical shape, into which only a wire core W1 of the electrical wire W can be inserted, as shown in FIG. 1, FIG. 2A, and FIG. 2B. The contact 20 can be formed by stamping and forming a metal plate. The cylindrical portion 21 is formed by cylindrically bending the metal plate so as to join together at a seam 26, as shown in FIG. 2B. The seam 26 is positioned at the bottom side of the seam 26.

The lance 22 is positioned in an intermediate portion of the cylindrical portion 21 along an axial direction thereof, as shown in FIG. 1 and FIG. 2A. The lance 22 extends diagonally into the cylindrical portion 21 from an upper portion opposing to the seam 26 of the cylindrical portion 21. At the tip of the lance 22, a sharp edge 23 is formed, which bites into the wire core W1 of the electrical wire W inserted into the cylindrical portion 21 for connecting to the electrical wire W, and stopping come-out of the electrical wire.

A pair of surface mount soldering portions 24, 25 are positioned at both ends of the cylindrical portion 21 along the axial direction. These surface mount soldering portions 24, 25 are solder connected, for example, to a conductive pad 41 formed on a surface of a substrate 40 shown in FIG. 4, or to a conductive pad 41 formed on the back side surface of the substrate 40 shown in FIG. 5. Further, the surface mount soldering portions 24, 25 are solder connected, for example, to a conductive pad 63 formed on a surface of a substrate 62 made up of an LED package 60 shown in FIG. 6, or to a conductive pad 63 formed on the back side surface of the substrate 62 made up of the LED package 60 shown in FIG. 7.

Hereupon, the surface mount soldering portion 24 positioned at the front end (the right end shown in FIG. 1 and the left end shown in FIG. 2A and FIG. 2B) of the cylindrical portion 21 along the axial direction extends in a direction orthogonal to the axial direction through a junction 24a downwardly extending from the vicinity of the seam 26 positioned on the bottom side of the front end. Moreover, the surface mount soldering portion 25 positioned at the rear end of the cylindrical portion 21 along the axial direction extends in a direction orthogonal to the axial direction through a junction 25a downwardly extending from the vicinity of the seam 26 positioned on the bottom side of the rear end. These pairs of the surface mount soldering portions 24, 25 extend in alternating directions (mutually opposite directions), as best shown in FIG. 2B.

Figure 3A:
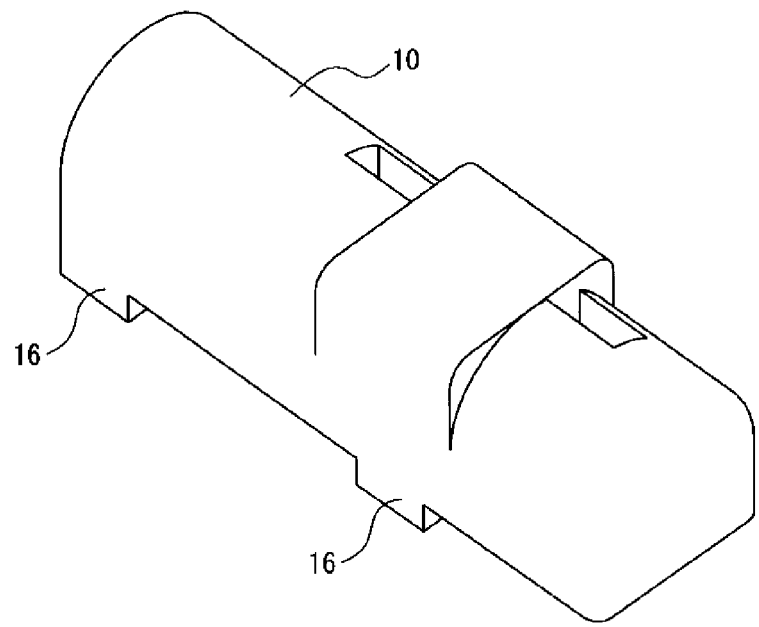
FIG. 3A is a perspective view of a housing used for the connector shown in FIG. 1, shown from obliquely upward toward the rear side.
Figure 3B:
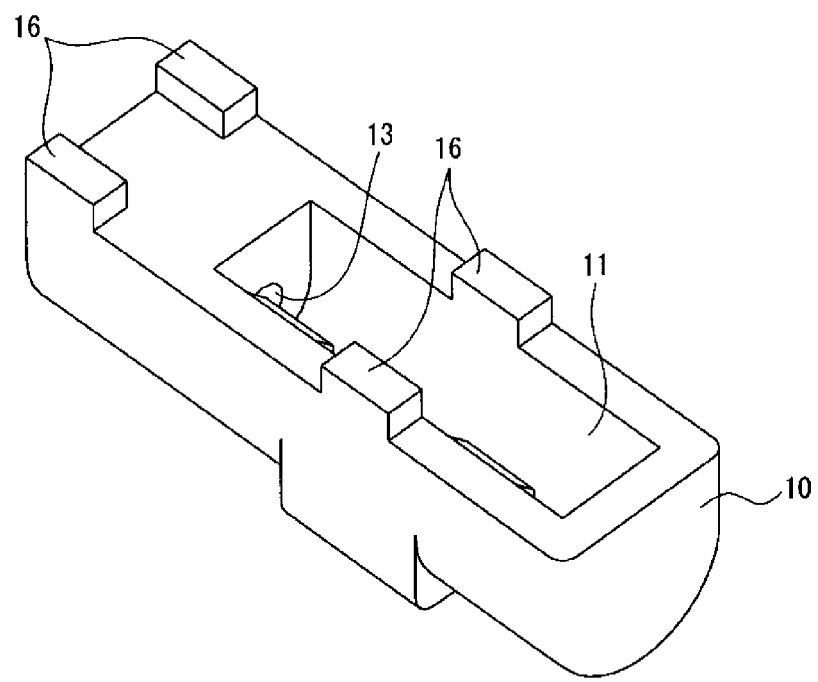
FIG. 3B is a perspective view of the housing used for the connector shown in FIG. 1, shown from obliquely downward toward the rear side.

Furthermore, the housing 10 has therein a contact receiving passageway 11, as shown in FIG. 1 and FIG. 3B. The housing 10 in the embodiment shown is formed by molding insulting resin. The contact receiving passageway 11 is open to the bottom side of the housing 10 to receive the contact 20 through the opening, as shown in FIG. 1 and FIG. 3B.

On the front side (the right side shown in FIG. 1, and the left side shown in FIG. 3A and FIG. 3B) of the housing 10, an opening 12 into which the electrical wire W is inserted is formed. The opening 12 is positioned on the front side of the housing 10, which is in communication with an insertion hole 13 through a stopper 14 formed by an inclined plane. At the forefront of the opening 12, an inclined plane 15 is formed, which facilitates insertion of the electrical wire W. The stopper 14 is formed as an inclined wall that positioned between the opening 12 and the insertion hole 13, the opening 12 having a large diameter than the insertion hole 13 which has a small diameter. The stopper 14 functions to stop insertion of the tip of the covering portion W2 of the electrical wire W, as shown in FIG. 1. Further, the insertion hole 13 is formed in the housing 10 so as to transition the opening 12 into the contact receiving passageway 11. The diameter of the insertion hole 13 is one which permits only insertion of the wire core W1 of the electrical wire W.

A plurality of mounting portions (standoff) 16 projected from the bottom are positioned on the bottom of the housing 10, as shown in FIG. 1, FIG. 3A, and FIG, 3B. Projection height of each mounting portion 16 is set such that when the contact 20 is received in the housing 10, as shown in FIG. 1, an undersurface of the surface mount soldering portions 24, 25 of the contact 20 projecting from the bottom of the housing 10 is positioned more below than the undersurface of the each mounting portion 16 ("undersurface" is illustrated only for the surface mount soldering portion 25, in view of cross-sectional position). This ensures secure soldering of the surface mount soldering portions 24, 25.

Figure 4:
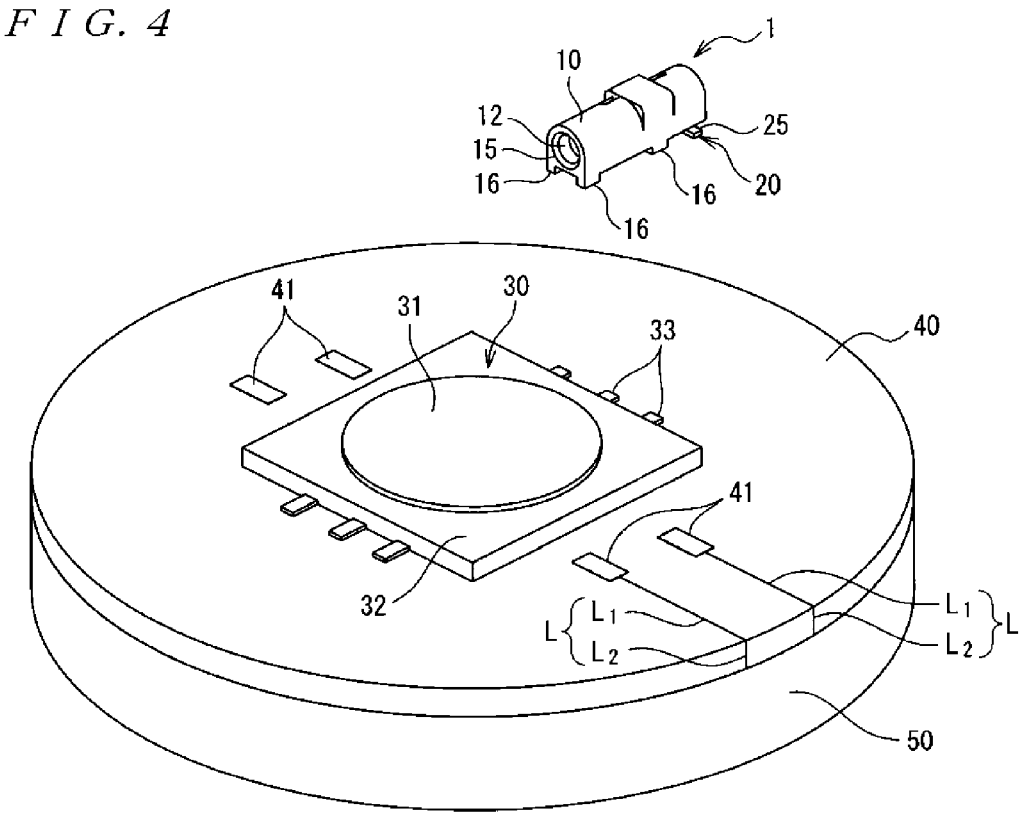
FIG. 4 is a perspective view of the connector shown in FIG. 1 before being mounted on the surface side of the substrate of which the LED module is mounted.

In FIG. 4, the connector 1 is not yet mounted on the surface of the substrate 40, on which the LED module 30 is mounted. Here, the LED module 30 is one in which the LED chip 31 is enclosed by resin 32 such as silicone resin etc., and a plurality of terminals 33 extending from the LED module 30 are connected to the surface of the substrate 40. The substrate 40 is made of a disc-shaped ceramic substrate, and the LED module 30 is mounted on the center of the surface. Around the LED module 30 of the substrate 40, two pairs of conductive pads 41 are provided. One pair out of the two pairs of the conductive pads 41 is connected to an anode side of the LED chip 31, whereas the other pair out of the two pairs is connected to a cathode side of the LED chip 31. On the back side surface of the substrate 40, a disk-shaped heat sink (heat radiation plate) 50 is attached closely to the substrate 40.

An explanation will be made to a mounting the connector 1 on the surface of the substrate 40. During assembly of the connector 1, the contact 20 is first received in the contact receiving passageway 11 of the housing 10 so that the pair of surface mount soldering portions 24, 25 projects from the bottom of the housing 10 as shown in FIG. 1.

The pair of surface mount soldering portions 24, 25 of the connector 1 is solder connected to the pair of the conductive pads 41 on the surface of the substrate 40. Moreover, the pair of surface mount soldering portions 24, 25 of the other connector 1 is solder connected to the other pair of the conductive pads 41 on the surface of the substrate 40. Thereby, the connector 1 is mounted on the surface of the substrate 40.

Next, the electrical wire W with the wire core W1 bared from the covering portion W2 is inserted into the connector 1 through the opening 12 until the tip of the covering portion W2 abuts against the stopper 14. Then, the wire core W1 of the electrical wire W is inserted into the cylindrical portion 21 of the contact 20 within the contact receiving passageway 11 through the insertion hole 13. In this state, the electrical wire W is pulled out slightly. By doing so, the sharp edge 23 formed at the tip of the lance 22 bites into the wire core W1 of the electrical wire W for connecting to the electrical wire W, which prevents the electrical wire from coming out. This enables supply of electricity from the power supply connected to the electrical wire W to the LED chip 31.

Thus, according to the contact 20 and the connector 1 using the contact of the shown embodiment, the lance 22 is positioned in the intermediate portion of the cylindrical portion 21 along the axial direction, which bites into the wire core W1 and prevents the electrical wire W from coming out. Thereby, merely inserting the wire core W1 of the electrical wire W into the cylindrical portion 21 allows connecting to the electrical wire W and preventing dislodgement thereof, thereby providing improved workability of wire connection and excellent efficiency in assembly.

According to the contact 20 and the connector 1 using the contact of the shown embodiment, the cylindrical portion 21 formed in the cylindrical shape is provided, into which only the wire core W1 of the electrical wire W is inserted. Thus, the contact 20 is devoid of the large-diameter portion to guide the tip of the covering portion W2 of the electrical wire W and of the shoulder acting as a stopper to stop insertion of the tip of the covering portion of the electrical wire. Hence, downsizing of the contact 20 and the connector 1 in which the contact 20 is received may be implemented. This provides the LED light excellent, so-called, in light distribution characteristics.

Moreover, according to the contact 20 and the connector 1 using the contact of the shown embodiment, the pair of surface mount soldering portions 24, 25 solder connected to the substrate 40 are positioned on the both ends of the cylindrical portion 21 along the axial direction, and each of the pair of surface mount soldering portions 24, 25 extends in the direction orthogonal to the axial direction from the end of the cylindrical portion 21. Thus, shortening of the axial length of the contact 20 and downsizing of the contact 20 may be implemented. This also enables downsizing of the connector 1, in which the contact 20 is received, which provides the contact 20 with excellent, so-called, in light distribution characteristics.

Due to the short length of the contact 20 along the axial direction, a small mounting area of the contact 20 may be achieved; thereby mounting the contact 20 and the connector 1 even on the small substrate 40 is possible.

The small mounting area of the contact 20 allows prolongation of the creepage distance from the heat sink (heat radiation plate) 50. Here, the creepage distance signifies a distance L expressed by the sum between a distance $L_2$ from a surface of the heat sink 50 to an upper surface of the substrate 40, corresponding to the thickness of the substrate 40 in FIG. 4, and a liner distance $L_1$ from an edge of the upper surface of the substrate 40 to the conductive pad 41. The creepage distance is defined as having to have a predetermined length stipulated under the Electrical Appliance and Material Safety Law.

In the contact 20 according to the invention, the pair of surface mount soldering portions 24, 25 extend in an alternating direction. This stabilizes a posture of the contact 20 during soldering, when the pair of surface mount soldering portions 24, 25 are positioned on the conductive pad 41, which excludes a possibility of falling down thereof. Additionally, one of the alternatively extending surface mount soldering portions 24, 25 is positioned further from the heat sink 50, thus extending creepage distance.

In the connector according to the shown embodiment, the opening 12 is formed in the housing 10, into which the electrical wire W is inserted, and the stopper 14 is also provided, which stops insertion of the tip of the covering portion W2 of the electrical wire W. This eliminates the need for the contact 20 to provide a structure allowing insertion of the covering portion W2 of the electrical wire W and a structure attaining the stopping function of the covering portion W2, thereby miniaturizing the contact 20. Consequently, it may exert the effect resulted from downsizing of the contact 20.

An explanation will be made, referring to FIG. 5, to a case where the connector 1 shown in FIG. 1 is attached to the back side surface of the substrate 40, on the surface side of which the LED module 30 is mounted.

Figure 5:
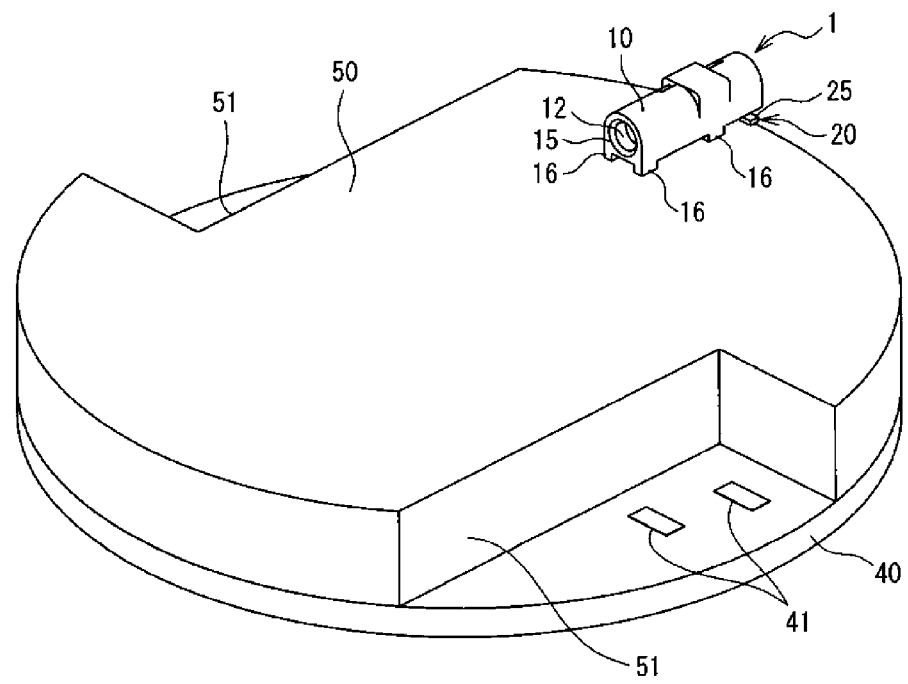
FIG. 5 is a perspective view showing the connector shown in FIG. 1 before it is mounted on the back side of the substrate where the LED module is mounted.

In FIG. 5, on the back side surface of the substrate 40, the heat sink 50 is attached closely on the substrate 40. Two cutouts 51 larger than a region in which the connector 1 is mounted are formed on the back side surface of the substrate 40. On the back side surface of the substrate 40, two pairs of the conductive pads 41 (only one pair is shown) are positioned in a region in which the connector 1 is mounted.

Upon mounting the connector 1, the pair of surface mount soldering portions 24, 25 of the connector 1 are solder connected to the pair of the conductive pads 41 on the back side surface of the substrate 40. Further, the pair of surface mount soldering portions 24, 25 of the other connector 1 are solder connected to the other pair of the conductive pads 41 on the back side surface of the substrate 40.

As with the case shown in FIG. 1, the electrical wire W where the wire core W1 bared from the covering portion W2 is inserted into the connector 1 through the opening 12 of each connector 1 until the tip of the covering portion W2 abuts against the stopper 14, and then the electrical wire W is slightly pulled out. Thereby, the sharp edge 23 formed at the tip of the lance 22 contacts and bites into the wire core W1 of the electrical wire W for connecting to the electrical wire W, and prevents the electrical wire W from coming out. Thus electricity from the power supply is provided through the electrical wire W to the LED chip 31.

In this manner, when the connector 1 shown in FIG. 1 is attached to the back side surface of the substrate 40 (the side on which the heat sink 50 is disposed), a small region (the size of the cutout 51) is provided that occupies the heat sink 50, owing to the short length of the contact 20 along the axial direction and the small mounting area of the contact 20 and the connector 1. Thus, the connector according to the invention has excellent heat discharge characteristics. The small mounting area of the contact 20 and the connector 1 obviates the need for increasing the size of the cutout 51 to lengthen the creepage distance from the heat sink 50.

In the connection described, note that even when the connector shown in FIG. 1 is attached to the back side surface of the substrate 40 (the side on which the heat sink 50 is positioned), the same effect may achieved in the case where the connector 1 is attached to the surface of the substrate 40, on the surface of which the LED module 30 is mounted.

An explanation will be made, referring to FIG. 6, to a case where the connector shown in FIG. 1 is attached to the surface of the substrate 62 made up of the LED package 60.

Figure 6:
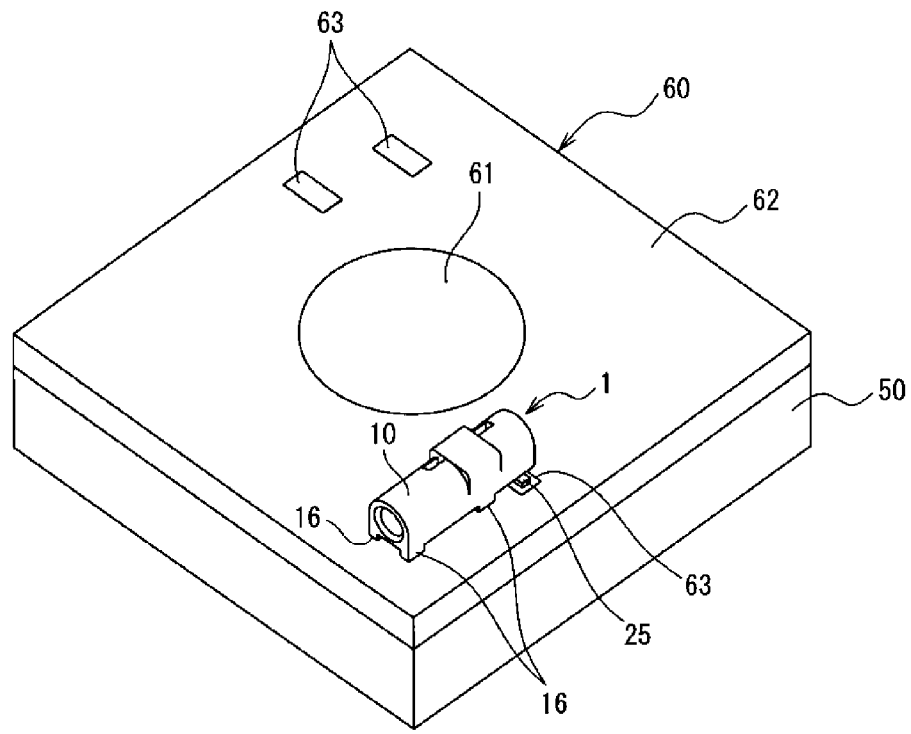
FIG. 6 is a perspective view showing the connector shown in FIG. 1 attached to the surface side of the substrate made up of the LED package wherein a heat sink is attached to the back side of the substrate made up of the LED package.

The LED package 60 shown in FIG. 6 is one in which the LED chip 61 is enclosed by the substrate 62. Two pairs of the conductive pads 63 are positioned on the surface of the substrate 62.

Upon mounting the connector 1, the pair of surface mount soldering portions 24, 25 of the connector 1 is solder connected to the pair of the conductive pads 63 on the surface of the substrate 62. Further, the pair of surface mount soldering portions 24, 25 of the other connector 1 is solder connected to the other pair of the conductive pads 63 on the surface of the substrate 62.

Subsequently, as with the case shown in FIG. 1, the electrical wire W is inserted into the connector 1 through the opening 12 of each connector 1 until the tip of the covering portion W2 abuts against the stopper 14, and then the electrical wire W is slightly pulled out. Thereby, the sharp edge 23 formed at the tip of the lance 22 bites into the wire core W1 of the electrical wire W for connecting to the electrical wire, and prevents the electrical wire W from coming out. This enables supply of electricity from the power supply to the LED chip 61 through the electrical wire W.

In this way, even when the connector shown in FIG. 1 is attached to the surface of the substrate 62 made up of the LED module 60, the same effect may be exerted as the case where the connector 1 shown in FIG. 1 is attached to the surface of the substrate 40, on the surface side of which the LED module 30 is mounted.

Finally, an explanation will be made, referring to FIG. 7, to a case where the connector 1 shown in FIG, 1 is attached to the back side surface of the substrate 62 made up of the LED package 60.

Figure 7:
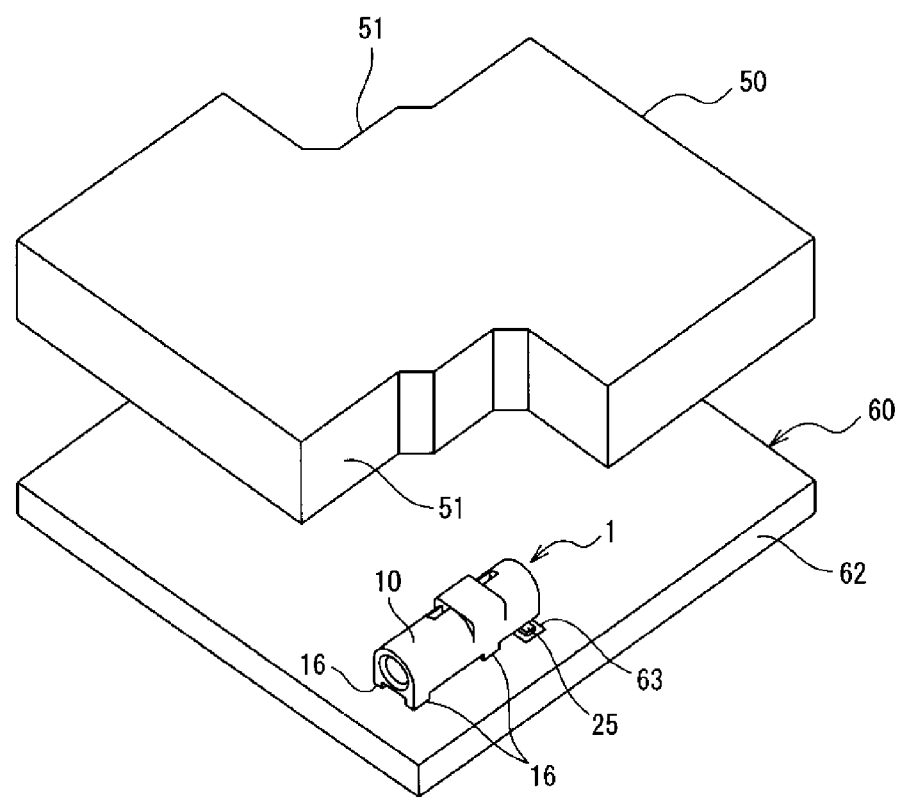
FIG. 7 is a perspective view showing the connector shown in FIG. 1 attached to the back side of the substrate made up of the LED package where the heat sink is shown apart from the back side of the substrate made up of the LED package.
Figure 8A:
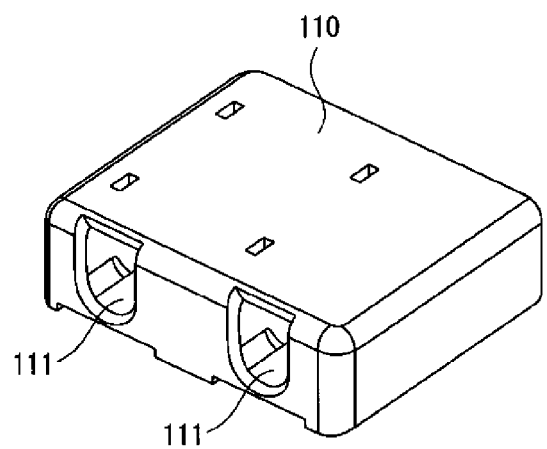
FIG. 8A is a perspective view of a housing of a known low-profile surface mount push-in connector.
Figure 8B:
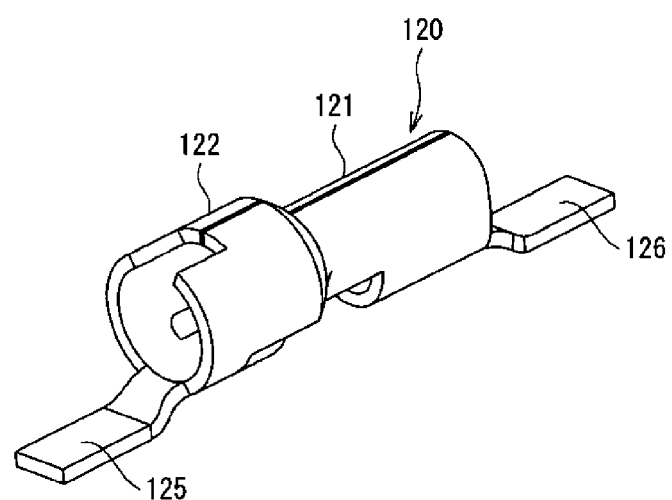
FIG. 8B is a perspective view of a contact of a known low-profile surface mount push-in connector.
Figure 8C:
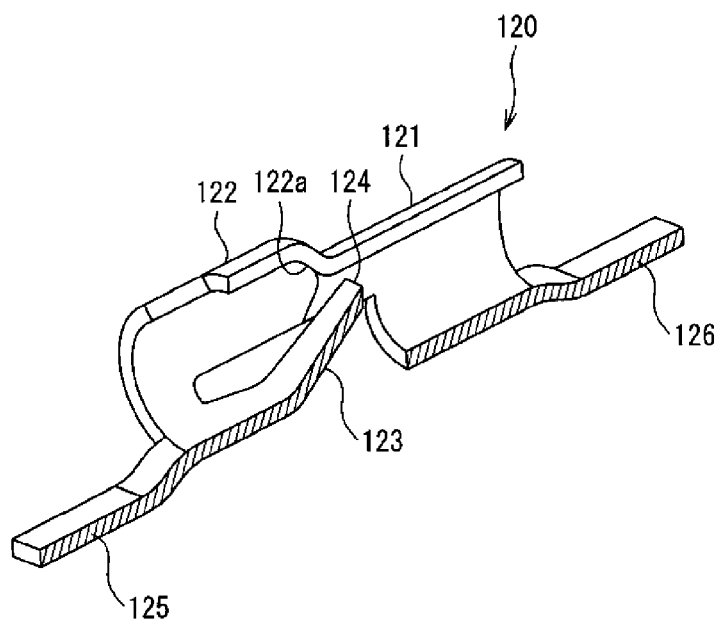
FIG. 8C is a sectional view of the known contact shown in FIG. 8B.

In FIG. 7, although the heat sink 50 is depicted apart from the substrate 62, the heat sink 50 is actually attached closely to the back side surface of the substrate 62. In the heat sink 50, two cutouts 51 larger than a region in which the connector 1 is mounted are formed on the back side surface of the substrate 62. Further, on the back side surface of the substrate 60, two pairs of the conductive pads 63 (only one pair is shown) are provided in the region in which the connector 1 is mounted.

Upon mounting the connector 1, the pair of surface mount soldering portions 24, 25 of the connector 1 is solder connected to the pair of the conductive pads 63 on the back side surface of the substrate 62. Further, the pair of surface mount soldering portions 24, 25 of the other connector 1 is solder connected to the other pair of the conductive pads 63 on the back side surface of the substrate 62.

After that, as with the case shown in FIG. 1, the electrical wire W, having the wire core W1 bared from the covering portion W2, is inserted into the connector 1 through the opening 12 of each connector 1 until the tip of the covering portion W2 abuts against the stopper 14, and then the electrical wire W is slightly pulled out. Thereby, the sharp edge 23 formed on the tip of the lance 22 bites into the wire core W1 of the electrical wire W for connecting to the electrical wire W, and preventing the electrical wire W from coming out. This enables supply of electricity from the power supply to the LED chip 61 through the electrical wire W.

In this way, even when the connector 1 shown in FIG. 1 is attached to the back side surface of the substrate 62 made up of the LED package 60, the same effect may be achieved as the case where the connector 1 shown in FIG. 1 is attached to the back side surface of the substrate 40.

It should be appreciated that while the description was made in terms of the shown embodiments of the invention, the invention may pursue various modifications and add improvements, without being limited to the above disclosure.

For example, the substrate on which the contact 20 is mounted is not restricted to the substrate 40 on which the LED module 30 is mounted and the substrate made up of the LED package 60. Alternatively, a general circuit board may of course be available.

Moreover, the pair of surface mount soldering portions 24, 25 may not necessarily extend in the alternating direction.

Besides, the pair of surface mount soldering portions is, for example, projected from respectively on the both ends of the cylindrical portion 21 along the axial direction so as to mutually extend in opposite directions. Taking such structure, the strength necessary for tearing off the contact to tear from the substrate may be increased.

Further, the pair of surface mount soldering portions may, for example, be projected from only on the one end of the cylindrical portion 21 along the axial direction so as to mutually extend in opposite directions. Accordingly, the creepage distance may be increased on the other end of the cylindrical portion 21 along the axial direction, and another part may have the increased flexibility of mounting thereof.

Figure 9A:
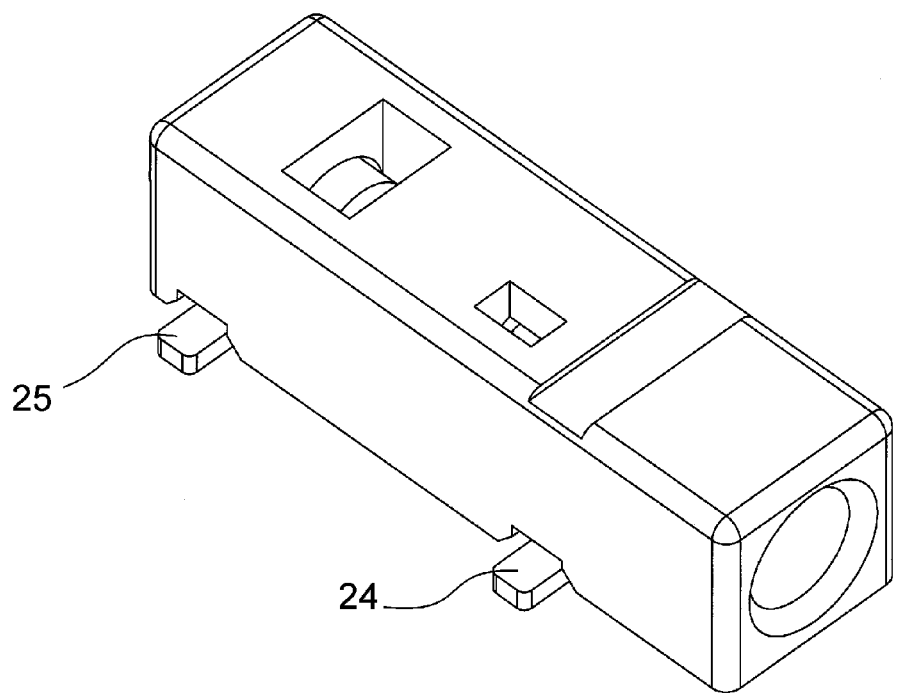
FIG. 9A is a top perspective view of an alternate connector similar to that shown in FIG. 1.
Figure 9B:
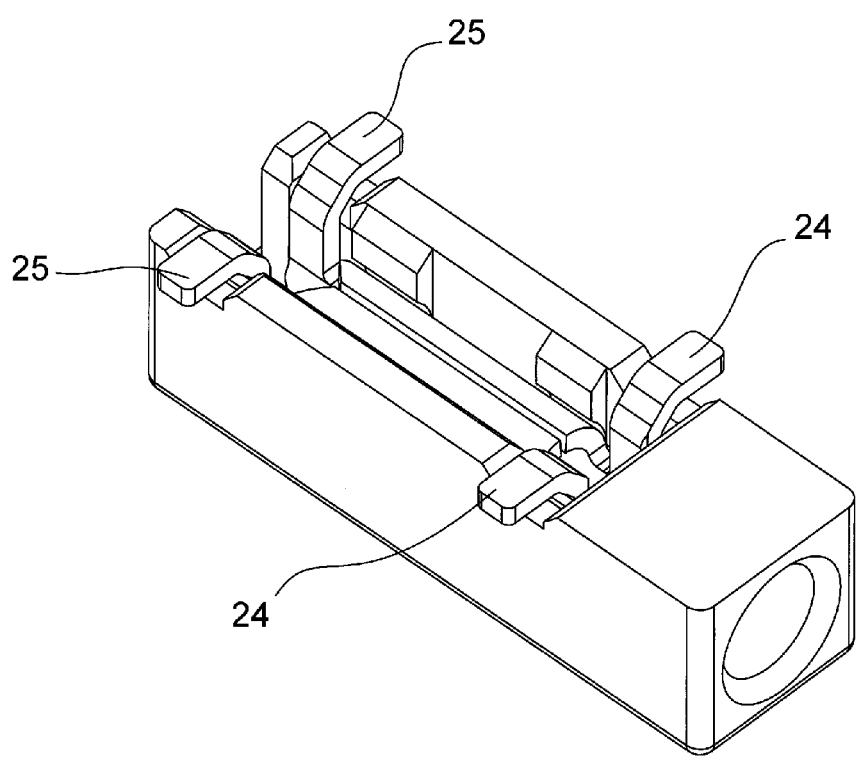
FIG. 9B is a bottom perspective view of the alternate connector shown in FIG. 9A.

Furthermore, as shown in the alternate embodiment of FIGS. 9A and 9B, two pairs of the surface mount soldering portions 24, 25 may project from the intermediate region apart from the both ends of the cylindrical portion along the axial direction so as to mutually extend in opposite directions. According to such a structure, a press fitting portion to the housing may be provided at least on the one end of the cylindrical portion along the axial direction, facilitating assembly of the contact into the housing.

What is claimed is:

1. A connector, comprising:
   a housing; and
   a surface mount contact that is received in the housing, the surface mount contact having:
   a cylindrical wire receiving portion;
   a securing lance positioned in an intermediate portion of the cylindrical portion along an axial direction thereof; and
   a pair of surface mount soldering portions projecting oppositely from both ends of the cylindrical portion in a direction orthogonal to the axial direction.

2. The connector according to claim 1, wherein the housing includes an opening into which an electrical wire is inserted.

3. The connector according to claim 2, wherein the housing further includes a stopper.

4. The connector according to claim 1, further comprising another pair of surface mount soldering portions projecting oppositely from the both ends of the cylindrical portion in the direction orthogonal to the axial direction.

5. The connector according to claim 1, wherein the surface mount contact is a push-in contact.

6. The connector according to claim 1, wherein the cylindrical portion is formed of metal plate and has a seam.

7. The connector according to claim 6, wherein the seam is positioned at a bottom side of the cylindrical portion.

8. The connector according to claim 7, wherein the lance is positioned in the intermediate portion of the cylindrical portion along the axial direction thereof and extends diagonally into the cylindrical portion from an upper portion opposing to the seam of the cylindrical portion.

9. The connector according to claim 1, wherein the lance includes a sharp edge that is positioned at a tip of the lance.

* * * * *